United States Patent
Tanaka et al.

(10) Patent No.: US 9,396,911 B2
(45) Date of Patent: Jul. 19, 2016

(54) DETERMINATION METHOD, CONTROL METHOD, DETERMINATION APPARATUS, PATTERN FORMING SYSTEM AND PROGRAM

(75) Inventors: Keisuke Tanaka, Sendai (JP); Kazuo Sawai, Sendai (JP); Hiroshi Nagahata, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1023 days.

(21) Appl. No.: 13/430,905

(22) Filed: Mar. 27, 2012

(65) Prior Publication Data

US 2012/0249986 A1 Oct. 4, 2012

(30) Foreign Application Priority Data

Mar. 28, 2011 (JP) .................................. 2011-070947

(51) Int. Cl.
*H01J 37/32* (2006.01)
*H01L 21/3065* (2006.01)

(52) U.S. Cl.
CPC ....... *H01J 37/32642* (2013.01); *H01J 37/3288* (2013.01); *H01J 37/3299* (2013.01); *H01J 37/32807* (2013.01); *H01J 37/32972* (2013.01); *H01J 2237/3343* (2013.01); *H01L 21/3065* (2013.01)

(58) Field of Classification Search
None
See application file for complete search history.

(56) References Cited

U.S. PATENT DOCUMENTS

| | | | |
|---|---|---|---|
| 8,845,853 B2* | 9/2014 | Yamawaku et al. | 156/345.27 |
| 2004/0007560 A1 | 1/2004 | Sakano | |
| 2004/0185583 A1* | 9/2004 | Tomoyasu et al. | 438/8 |
| 2005/0120960 A1* | 6/2005 | Chen | 118/728 |
| 2006/0015206 A1* | 1/2006 | Funk et al. | 700/121 |
| 2008/0099450 A1 | 5/2008 | Lewington | |
| 2008/0228308 A1* | 9/2008 | Phelps | 700/121 |
| 2010/0036518 A1* | 2/2010 | Funk et al. | 700/121 |
| 2010/0243606 A1* | 9/2010 | Koshimizu et al. | 216/67 |
| 2010/0326957 A1* | 12/2010 | Maeda et al. | 216/67 |
| 2011/0220609 A1* | 9/2011 | Yaegashi et al. | 216/12 |

FOREIGN PATENT DOCUMENTS

| | | |
|---|---|---|
| CN | 1454391 A | 11/2003 |
| CN | 1860600 A | 11/2006 |
| CN | 101847558 A | 9/2010 |
| JP | 2003-229408 A | 8/2003 |
| JP | 2004-510152 A | 4/2004 |
| JP | 2005-033187 A | 2/2005 |
| JP | 2006-506812 A | 2/2006 |
| JP | 2006-216822 A | 8/2006 |
| JP | 2008-078208 A | 4/2008 |
| JP | 2010-272758 A | 12/2010 |

(Continued)

*Primary Examiner* — Anita Alanko
(74) *Attorney, Agent, or Firm* — Pearne & Gordon LLP

(57) ABSTRACT

A determination method, a control method, a determination apparatus, a pattern forming system, and a storage medium can determine a replacement time of a focus ring accurately and quickly. The determination method is capable of determining the replacement time of a focus ring that surrounds a substrate to increase uniformity of a pattern in a surface of the substrate when the pattern is formed by etching a film on the substrate. The determination method includes measuring a shape or a critical dimension of the pattern; and determining the replacement time of the focus ring based on the measured shape or the measured critical dimension of the pattern.

6 Claims, 13 Drawing Sheets

(56) References Cited

FOREIGN PATENT DOCUMENTS

| KR | 10-2001-0101716 A | 11/2001 |
| KR | 10-2009-0103711 A | 10/2009 |
| TW | 200826185 A | 6/2008 |
| WO | 02/27288 A1 | 4/2002 |
| WO | 2004/044974 A2 | 5/2004 |
| WO | 2004/059702 A2 | 7/2004 |

* cited by examiner

WAFER

A

B

DETERMINATION METHOD, CONTROL METHOD, DETERMINATION APPARATUS, PATTERN FORMING SYSTEM AND PROGRAM

CROSS-REFERENCE TO RELATED APPLICATION

This application claims the benefit of Japanese Patent Application No. 2011-070947 filed on Mar. 28, 2011, the entire disclosures of which are incorporated herein by reference.

FIELD OF THE INVENTION

The present disclosure relates to a determination method of determining a replacement time of a focus ring, and also relates a control method, a determination apparatus, a pattern forming system, and a program.

BACKGROUND OF THE INVENTION

In a plasma processing apparatus that etches a film on a substrate, a focus ring is provided to surround the substrate in order to increase uniformity (etching uniformity) of a pattern in a surface of the substrate (for example, Patent Documents 1 and 2). Since the focus ring is etched and eroded by plasma as time passes by, the uniformity of the pattern in the surface of the substrate is decreased. Therefore, the focus ring is regularly replaced according to a using time thereof.

Patent Document 1: Japanese Patent Laid-open Publication No. 2008-078208

Patent Document 2: Japanese Patent Laid-open Publication No. 2003-229408

However, the focus ring is replaced without monitoring an erosion state of the focus ring. For this reason, the focus ring may be replaced even when it is still usable, or the focus ring may not be replaced even when it is badly eroded.

BRIEF SUMMARY OF THE INVENTION

In view of the foregoing, illustrative embodiments provide a determination method capable of determining a replacement time of a focus ring accurately and quickly. Further, illustrative embodiments also provide a control method, a determination apparatus, a pattern forming system, and a program.

In accordance with one aspect of an illustrative embodiment, there is provided a determination method for determining a replacement time of a focus ring that surrounds a substrate to increase uniformity of a pattern in a surface of the substrate when the pattern is formed by etching a film on the substrate. The determination method includes measuring a shape or a critical dimension of the pattern; and determining the replacement time of the focus ring based on the measured shape or the measured critical dimension of the pattern.

In the determination method in accordance with the illustrative embodiment, the shape or the critical dimension of the pattern formed by etching the film on the substrate is measured. Then, based on the measured shape or the measured critical dimension of the pattern on the substrate, in order to increase uniformity of the pattern in the surface of the substrate, the replacement time of the focus ring that surrounds the substrate is determined.

In the measuring a shape or a critical dimension of the pattern, the shape or the critical dimension may be measured at a multiple number of positions on the pattern. Further, in the determining the replacement time of the focus ring, when a deviation in data on the shape or the critical dimension measured at the multiple number of positions on the pattern is greater than a predetermined critical value, it may be determined that it is time to replace the focus ring.

In the determination method in accordance with the illustrative embodiment, the shape or the critical dimension is measured at the multiple number of positions on the pattern. Then, when the deviation in the data on the shape or the critical dimension measured at the multiple number of positions on the pattern is greater than the certain critical value, it is determined that it is time to replace the focus ring.

The data on the shape of the pattern may include a sidewall angle of the pattern, and the data on the critical dimension of the pattern may include a line width or a line height of the pattern.

In the determination method in accordance with the illustrative embodiment, the data on the shape of the pattern includes the sidewall angle of the pattern. Further, the data on the critical dimension of the pattern includes the line width or the line height.

The focus ring may be used in various kinds of etching processes.

In the determination method in accordance with the illustrative embodiment, the focus ring is used in various kinds of etching processes.

In the measuring a shape or a critical dimension of the pattern, the shape or the critical dimension of the pattern may be measured by a scatterometry method.

In the determination method in accordance with the illustrative embodiment, the shape or the critical dimension of the pattern is measured by the scatterometry method.

In accordance with another aspect of an illustrative embodiment, there is provided a control method for controlling a temperature of a focus ring that surrounds a substrate to increase uniformity of a pattern in a surface of the substrate when the pattern is formed by etching a film on the substrate. The control method includes setting a temperature of the focus ring; measuring a shape or a critical dimension of the pattern; and performing a feedback control of the temperature set during the setting a temperature of the focus ring based on the measured shape or the measured critical dimension of the pattern.

In the control method in accordance with the illustrative embodiment, in order to increase uniformity of the pattern in the surface of the substrate when the pattern is formed by etching the film on the substrate, the temperature of the focus ring that surrounds the substrate is set. Then, the shape or the critical dimension of the pattern is measured. Thereafter, based on the measured shape or the measured critical dimension of the pattern, the set temperature of the focus ring is controlled through a feedback control.

In the measuring a shape or a critical dimension of the pattern, the shape or the critical dimension may be measured at a multiple number of positions on the pattern. Further, in the performing a feedback control of the temperature set during the setting a temperature of the focus ring, when a deviation in data on the shape or the critical dimension measured at the multiple number of positions on the pattern is greater than a predetermined critical value, the temperature of the focus ring may be controlled through the feedback control.

In the control method in accordance with the illustrative embodiment, the shape or the critical dimension is measured at the multiple number of positions on the pattern. Then, when the deviation in the data on the shape or the critical dimension measured at the multiple number of positions on the pattern is greater than the certain critical value, the temperature of the focus ring is controlled through a feedback control.

In accordance with still another aspect of an illustrative embodiment, there is provided a determination apparatus that determines a replacement time of a focus ring that surrounds a substrate to increase uniformity of a pattern in a surface of the substrate when the pattern is formed by etching a film on the substrate. The determination apparatus includes a measurement device for measuring a shape or a critical dimension of the pattern; and a determination device for determining the replacement time of the focus ring based on the measured shape or the measured critical dimension of the pattern.

In the determination apparatus in accordance with the illustrative embodiment, the shape or the critical dimension of the pattern formed by etching the film on the substrate is measured. Then, based on the measured shape or the measured critical dimension of the pattern, in order to increase uniformity of the pattern in the surface of the substrate, the replacement time of the focus ring that surrounds the substrate is determined.

The measurement device may be configured to measure the shape or the critical dimension at a multiple number of positions on the pattern. Further, the determination device may be configured to determine whether it is time to replace the focus ring when a deviation in data on the shape or the critical dimension measured at the multiple number of positions on the pattern is greater than a predetermined critical value.

In the determination apparatus in accordance with the illustrative embodiment, the shape or the critical dimension is measured at the multiple number of positions on the pattern. When the deviation in the data on the shape or the critical dimension measured at the multiple number of positions on the pattern is greater than the certain critical value, the determination apparatus is configured to determine whether it is time to replace the focus ring.

In accordance with still another aspect of an illustrative embodiment, there is provided a pattern forming system including a pattern forming apparatus and a measurement apparatus. The pattern forming apparatus includes a forming device for forming a pattern by etching a film on a substrate; a focus ring that surrounds the substrate to increase uniformity of the pattern in a surface of the substrate; and a control device for controlling a temperature of the focus ring. Further, the measurement apparatus includes a measurement device for measuring a shape or a critical dimension of the pattern; and a transmitting device for transmitting, to the pattern forming apparatus, information based on the measured shape or the measured critical dimension of the pattern. Here, the pattern forming apparatus may further include a receiving device for receiving the information transmitted by the transmitting device. Further, the control device may be configured to perform a feedback control of the temperature of the focus ring based on the information received by the receiving device.

The pattern forming system in accordance with the illustrative embodiment includes the pattern forming apparatus that forms the pattern by etching the film on the substrate; and the measurement apparatus that measures the shape or the critical dimension of the pattern. The pattern forming apparatus includes the focus ring that surrounds the substrate in order to increase uniformity of the pattern in the surface of the substrate; and the control device that controls the temperature of the focus ring. The measurement apparatus transmits, to the pattern forming apparatus, the information of the measured shape or the measured critical dimension of the pattern. The pattern forming apparatus receives the information of the measured shape or the measured critical dimension of the pattern from the measurement apparatus. The control device of the pattern forming apparatus is configured to perform a feedback control of the temperature of the focus ring based on the received information of the measured shape or the measured critical dimension of the pattern.

The measurement device may be configured to measure the shape or critical dimension at a multiple number of positions on the pattern. Further, the transmitting device may be configured to transmit, to the pattern forming apparatus, deviation information when a deviation in data on the shape or the critical dimension of the pattern is greater than a predetermined critical value. The receiving device may be configured to receive the deviation information. The control device may be configured to perform the feedback control of the temperature of the focus ring based on the received deviation information.

In the pattern forming system in accordance with the illustrative embodiment, the measurement apparatus is configured to measure the shape or the critical dimension at the multiple number of positions on the pattern. When the deviation in the data on the shape or the critical dimension measured at the multiple number of positions on the pattern is greater than the certain critical value, the measurement apparatus transmits, to the pattern forming apparatus, the information of the deviation in the data. The pattern forming apparatus receives the information of the deviation in the data from the measurement apparatus. The pattern forming apparatus performs a feedback control of the temperature of the focus ring based on the received information of the deviation in the data.

The pattern forming apparatus may be a plasma processing apparatus for performing various kinds of etching processes.

In the pattern forming system in accordance with the illustrative embodiment, the pattern forming apparatus is the plasma processing apparatus that performs the various kinds of etching processes.

In accordance with still another aspect of an illustrative embodiment, there is provided a computer-readable storage medium having stored thereon computer-executable instructions, in response to execution, cause a determination apparatus to perform a determination method for determining a replacement time of a focus ring that surrounds a substrate in order to increase uniformity of a pattern in a surface of the substrate when the pattern is formed by etching a film on the substrate. The determination method includes retrieving a shape or a critical dimension from a storage unit that stores therein data on the shape or the critical dimension measured at a multiple number of positions on the pattern; calculating a deviation in the data on the retrieved shape or the retrieved critical dimension; and determining that it is time to replace the focus ring if the calculated deviation in the data on the shape or critical dimension is greater than a predetermined critical value.

The computer-readable storage medium in accordance with the illustrative embodiment causes the determination apparatus to perform the process of retrieving the shape or the critical dimension measured at the multiple number of positions on the pattern formed by etching the film on the substrate from the storage unit that stores the shape or the critical dimension at the multiple number of positions on the pattern. Then, the storage medium causes the determination apparatus to perform, the process of calculating the deviation in data on the retrieved shape or the critical dimension at the multiple number of positions on the pattern. If the deviation in the data on the shape or the critical dimension measured at the multiple number of positions on the pattern is greater than the certain critical value, the storage medium causes the determination apparatus to perform the process of determining that it is time to replace the focus ring that surrounds the substrate in order to increase uniformity of the pattern in the surface of the substrate.

In accordance with the determination method of the illustrative embodiment, it is possible to determine a replacement time of the focus ring accurately and quickly.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Hereinafter, illustrative embodiments will be described with reference to the accompanying drawings.

A determination apparatus (measurement apparatus) in accordance with an illustrative embodiment measures uniformity of a pattern (etching pattern) in a surface of a wafer (substrate). Here, the pattern is formed by etching a film on the wafer by a plasma processing apparatus. The uniformity of the pattern in the surface of the wafer is, for example, uniformity of a critical dimension (CD) or a shape of the pattern in the surface of the wafer. If the measured uniformity of the pattern in the surface of the wafer is greater than a certain critical value, the determination apparatus determines a replacement time of a focus ring provided within the plasma processing apparatus.

The determination apparatus measures the critical dimension (CD) or the shape of the pattern by a scatterometry method. The scatterometry method as a light scattering method includes, for example, an ellipsometry method, a spectroscopic ellipsometry method, a reflectometry method, a spectroscopic reflectometry method, and a polarized spectroscopic reflectometry method. Hereinafter, there will be explained a determination apparatus using the spectroscopic ellipsometry method as one example of the scatterometry method.

The present disclosure is not limited to the following illustrative embodiments.

First Illustrative Embodiment

A spectroscopic ellipsometer as a determination apparatus (measurement apparatus) is provided inside or outside a plasma processing apparatus. In the first illustrative embodiment, the spectroscopic ellipsometer provided outside the plasma processing apparatus will be explained. The spectroscopic ellipsometer may be any one of a rotating-analyzer-type ellipsometer, a rotating-compensator-type ellipsometer, and a phase-modulator-type ellipsometer. Hereinafter, there will be explained the phase-modulator-type ellipsometer.

Figure 1:
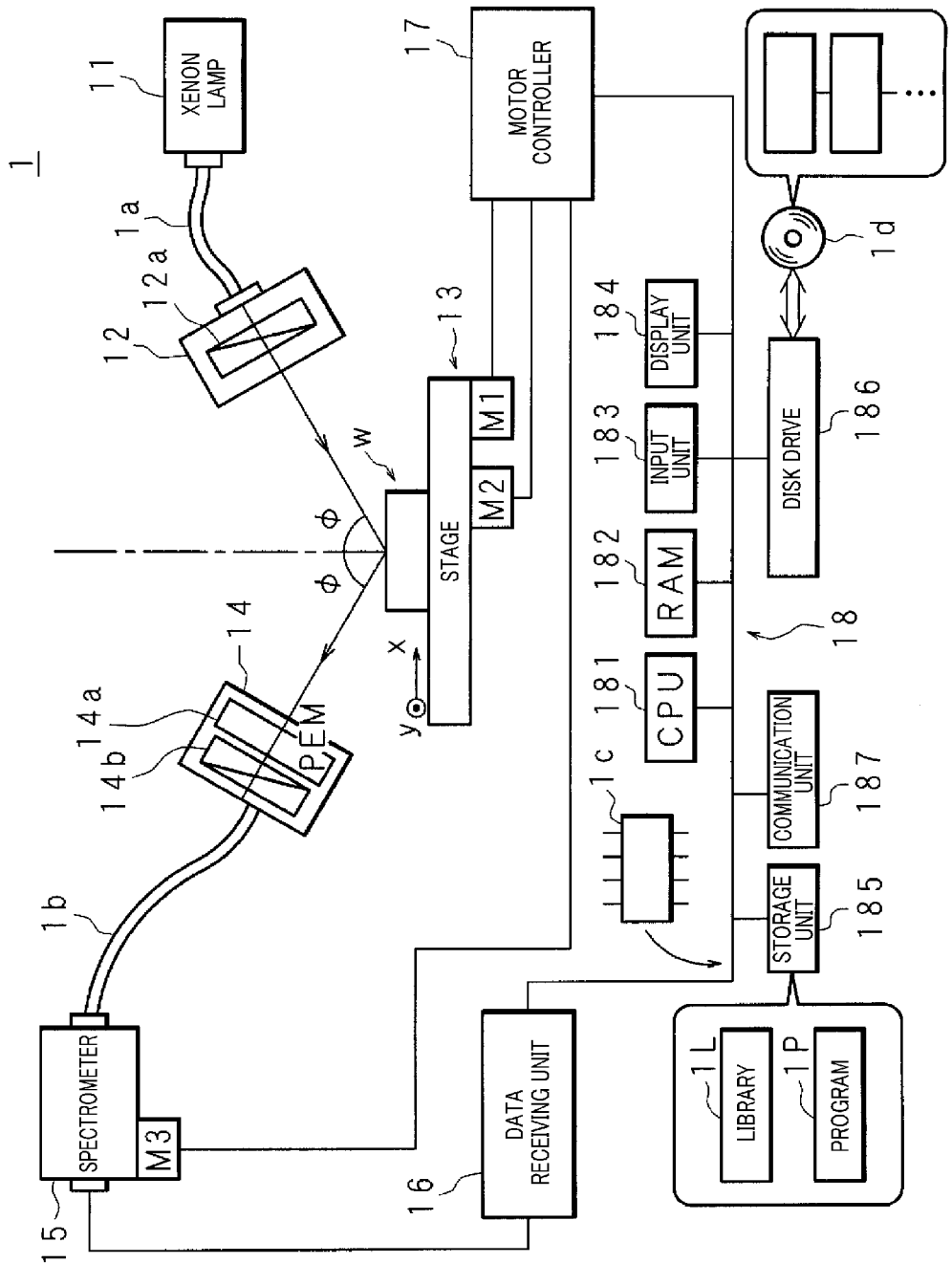
FIG. 1 is a block diagram of a configuration example of a spectroscopic ellipsometer.

FIG. 1 is a block diagram of a configuration example of a spectroscopic ellipsometer 1.

The spectroscopic ellipsometer 1 includes a xenon lamp 11, a light irradiation unit 12, a stage 13, a light receiving unit 14, a spectrometer (measurement unit) 15, a data receiving unit 16, a motor controller 17, and a computer 18. The spectroscopic ellipsometer 1 measures a critical dimension and a shape of a pattern on a wafer W mounted on the stage 13. The pattern is formed by etching a film on the wafer W by using a photoresist as a mask.

On the wafer W, a silicon oxide ($SiO_2$) film may be formed. Further, on the silicon oxide film, an amorphous silicon film, a polysilicon film or a silicon nitride ($Si_3N_4$) film may be formed.

The spectroscopic ellipsometer 1 irradiates polarized light onto the wafer W, receives light reflected from the wafer W, and, then, measures a polarization state of the reflected light. Thereafter, based on the measurement result and a model for the pattern on the wafer W, the spectroscopic ellipsometer 1 analyzes the critical dimension and the shape of the pattern on the wafer W. Here, instead of the wafer W, a compound semiconductor substrate, an epitaxial film of a single-layer structure, an epitaxial film of a multi-layer structure, an insulating film, a sapphire substrate or a glass substrate may be used.

The spectroscopic ellipsometer 1 is divided into two systems: a measurement-analysis system including a pair of the light irradiation unit 12 and the light receiving unit 14; and a driving system.

In the spectroscopic ellipsometer 1, the xenon lamp 11 and the light irradiation unit 12 as parts of the measurement-analysis system are connected with each other via a first optical fiber cable 1a. The spectroscopic ellipsometer 1 irradiates polarized light onto the wafer W mounted on the stage 13, and the light receiving unit 14 receives light reflected from the wafer W. The light receiving unit 14 is connected with the spectrometer 15 via a second optical fiber cable 1b. The light receiving unit 14 is configured to measure each wavelength and transmits the measurement result as an analogue signal to the data receiving unit 16. The data receiving unit 16 converts the analogue signal into a certain value, and transmits the converted value to the computer 18. The computer 18 analyzes the pattern.

The light irradiation unit 12 and the light receiving unit 14 of the spectroscopic ellipsometer 1 are fixed such that an incident angel ($\phi$) and a reflection angel ($\phi$) of the light with respect to the wafer W are substantially equal to each other at a certain angle. The light irradiation unit 12 and the light receiving unit 14 may have variation of the incident angle ($\phi$)

and the reflection angel (φ) while controlling the incident angle (φ) and the reflection angel (φ) to be substantially equal to each other.

The spectroscopic ellipsometer 1 includes a first motor M1 to a third motor M3 as parts of the driving unit. The first motor M1 and the second motor M2 are provided at the stage 13, and the third motor M3 is provided at the spectrometer 15. The spectroscopic ellipsometer 1 controls operations of the first motor M1 to the third motor M3 by using the motor controller 17 connected with the computer 18, so that the stage 13 and the spectrometer 15 have a position and a posture appropriate for measurement. The motor controller 17 controls the operations of the first motor M1 to the third motor M3 in response to an instruction outputted from the computer 18.

The xenon lamp 11 serves as a light source and generates white light having multi-wavelengths. The xenon lamp 11 transmits the generated white light to the light irradiation unit 12 via the first optical fiber cable 1a. The light irradiation unit 12 includes therein a polarizer 12a, and the white light is polarized by the polarizer 12a. Then, the polarized white light is transmitted onto the wafer W.

The stage 13 is provided at a moving rail (not illustrated) so as to be slidably moved. The stage 13 can be moved by the operations of the first motor M1 and the second motor M2 along an x-axis direction and a y-axis direction (direction orthogonal to the paper surface of FIG. 1) in FIG. 1. While the stage 13 is moved, an incident position of the light onto the wafer W mounted on the stage 13 is changed appropriately, and a surface of the wafer W is analyzed. A wafer mounting surface of the stage 13 is colored in black in order to prevent reflection of the light.

Further, in the present illustrative embodiment, the stage 13 moving along the x-axis direction and the y-axis direction has been explained. However, the present illustrative embodiment is not limited thereto. By way of example, while the stage 13 is fixed, the light irradiation unit 12 and the light receiving unit 14 may be moved so that an irradiation position is moved along the x-axis direction and the y-axis direction. Otherwise, both the stage 13 and a pair of the light irradiation unit 12 and the light receiving unit 14 may be moved along the x-axis direction and the y-axis direction.

The light receiving unit 14 receives the light reflected from the wafer W and measures a polarization state of the received light. The light receiving unit 14 includes therein a PEM (Photo Elastic Modulator) 14a and an analyzer 14b, and the light reflected from the wafer W is induced to the analyzer 14b via the PEM 14a. The received light is phase-modulated at a certain frequency (for example, about kHz) by the PEM 14a in the light receiving unit 14. Accordingly, linearly polarized light is converted into elliptically polarized light. The analyzer 14b selectively receives polarized light from various polarized lights which are phase-modulated by the PEM 14a and measures the received light.

The spectrometer 15 includes therein a reflection mirror, a diffraction grating, a photo multiplier (PMT), and a control unit. The light transmitted from the light receiving unit 14 via the second optical fiber cable 1b is reflected from the reflection mirror, and the reflected light is induced to the diffraction grating. An angle of the diffraction grating is changed by the third motor M3, and, thus, a wavelength of the light to be emitted is varied. Since the light introduced into the spectrometer 15 is amplified by the PMT, even if the amount of lights is small, the measured signal (light) is stabilized. The control unit generates an analogue signal for the measured wavelength, and the analogue signal is transmitted to the data receiving unit 16 from the spectrometer 15.

The data receiving unit 16 calculates an amplitude ratio (Ψ) and a phase difference (Δ) of the reflected light for each wavelength based on the signal from the spectrometer 15. The amplitude ratio (Ψ) and the phase difference (Δ) indicate a polarization state (p-polarization and s-polarization) of the reflected light. Further, the data receiving unit 16 transmits the calculation result to the computer 18. The amplitude ratio (Ψ) and the phase difference (Δ) have a relationship of the following equation (1), with respect to an amplitude reflection coefficient (Rp) of the p-polarization and an amplitude reflection coefficient (Rs) of the s-polarization.

[Equation 1]

$$Rp/Rs = \tan \Psi \cdot \exp(i \cdot \Delta) \quad (1)$$

Herein, i denotes an imaginary unit (the same goes hereinafter). Further, Rp/Rs is referred to as a polarization ratio (ρ).

The computer 18 includes a CPU (Central Processing Unit) (determination unit) 181, a RAM (Random Access Memory) 182, an input unit 183, a display unit 184, a storage unit 185, a disk drive 186, and a communication unit (transmitting unit) 187. The CPU 181 is connected to each component of hardware of the computer 18 via a bus. The CPU 181 controls each components of hardware and performs various software processes according to various programs stored in the storage unit 185.

The RAM 182 is a semiconductor device. The RAM 182 records and retrieves necessary information in response to instructions of the CPU 181. The input unit 183 is an input device such as a keyboard and a mouse or a touch panel. The display unit 184 is, for example, a liquid crystal display or an organic EL (Electro Luminescence) display.

The storage unit 185 is, for example, a hard disk or a mass memory. Various programs such as a program for analysis and a program for controlling a movement of the stage 13 are previously stored in the storage unit 185.

The storage unit 185 further stores therein a library 1L, critical values, and a program 1P. The library 1L is an electronic file including an amplitude ratio (Ψ) and a phase difference (Δ) for each wavelength. The amplitude ratio (Ψ) and the phase difference (Δ) for each wavelength are previously calculated based on parameters such as the critical dimension and the shape of the pattern. The computer 18 performs a fitting process of fitting the amplitude ratio (Ψ) and the phase difference (Δ) in the polarization state calculated by the data receiving unit 16 to an amplitude ratio (Ψ) and a phase difference (Δ) of a model stored in the library 1L. Further, a critical dimension and a shape of a pattern corresponding to the amplitude ratio (Ψ) and the phase difference (Δ) of the model is specified by the computer 18.

The critical values are used for determining whether or not to replace the focus ring. If deviations in the measurement values of the critical dimension and the shape of the pattern are greater than the critical value, the program 1P displays a message of replacement of the focus ring on the display unit 184. The critical values may be related to accuracy required for a product device, and the critical values may be varied depending on a kind of a device and a generation thereof.

The disk drive 186 reads information from an optical disk 1d as an external storage medium such as a CD (Compact Disk), a DVD (Digital Versatile Disk) or a BD (Blu-ray Disk: registered trademark) and records information in the optical disk 1d.

The communication unit 187 is an interface to communicate with an external computer. The communication unit 187 may be connected with a LAN (Local Area Network), Internet, or a telephone line.

Hereinafter, an operation of the spectroscopic ellipsometer 1 will be explained.

The wafer W etched by the plasma processing apparatus is mounted on the stage 13 of the spectroscopic ellipsometer 1. A diameter of the wafer W is, for example, about 300 mm. A film serving as the pattern is, for example, an organic film. The organic film may have a multi-layered structure, and some layers may contain, for example, Si.

The xenon lamp 11 radiates white light. The light irradiation unit 12 converts the white light radiated from the xenon lamp 11 into linearly polarized light, and the linearly polarized light is irradiated onto the wafer W from the light irradiation unit 12. The light receiving unit 14 receives light reflected from the wafer W, and a polarization state of the received light is measured by the light receiving unit 14. The spectrometer 15 generates an analogue signal for a wavelength measured by the light receiving unit 14, and the analogue signal is transmitted to the data receiving unit 16 from the spectrometer 15. The data receiving unit 16 calculates amplitude ratios ($\Psi$) and phase differences ($\Delta$) of p-polarized light and s-polarized light for each wavelength based on the signal from the spectrometer 15. The data receiving unit 16 transmits the calculation result to the computer 18. The computer 18 stores the calculated value in the storage unit 185.

Here, the wavelength for measurement is in a range of, for example, from about 250 nm to about 750 nm.

Figure 2:
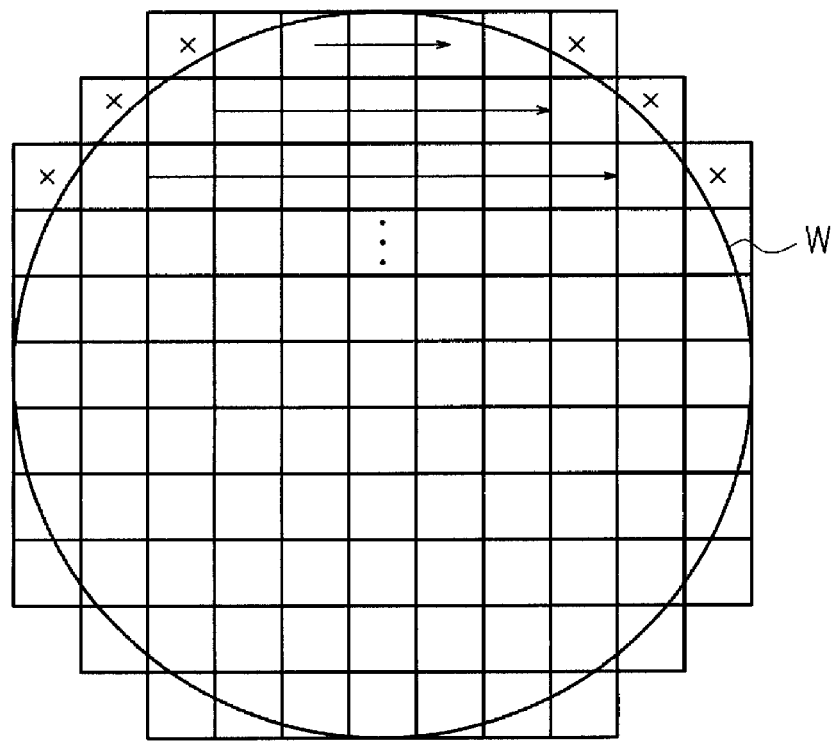
FIG. 2 is an explanatory diagram illustrating a layout of measurement positions in a surface of a wafer.

FIG. 2 is an explanatory diagram illustrating a layout of measurement positions in a surface of a wafer W. The surface of the wafer W is divided into about 100 square sections. A substantial center of a single square section is measured as a single measurement position.

Upon the completion of the measurement for a certain square section, the spectroscopic ellipsometer 1 moves the stage 13 along the x-axis direction or the y-axis direction by the motor controller 17, and a measurement position, to which linearly polarized light is irradiated, is changed to an adjacent square section. As indicated by an arrow of FIG. 2, the measurement position is changed in, for example, the x-axis direction. When the measurement position is at a peripheral portion of the wafer W or outside the wafer W, the stage 13 is moved in the y-axis direction by a single square section. Then, the measurement position is changed by a single square section from an end of the wafer W to the other end thereof in the x-axis direction.

Further, when the substantial center of the square section as the measurement position is located outside the wafer W (indicated as "x" in FIG. 2), the measurement is not performed. If the measurement position is near the peripheral portion of the wafer W (for example, a region of about 1 mm to about 2 mm from the peripheral portion of the wafer W toward the center thereof), the measurement is not performed, or a measurement value is not adopted.

After the measurement for the wafer W is finished, when the measurement data are stored in the storage unit 185 of the computer 18, the CPU 181 performs a fitting process of fitting the measured amplitude ratio ($\Psi$) and the measured phase difference ($\Delta$) to the amplitude ratio ($\Psi$) and phase difference ($\Delta$) stored in the library 1L. Then, the CPU 181 specifies a critical dimension and a shape of a pattern corresponding to the amplitude ratio ($\Psi$) and the phase difference ($\Delta$) stored in the library 1L for each measurement position, and the specified critical dimensions and the specified shapes are stored in the storage unit 185 by the computer 18.

Figure 3:
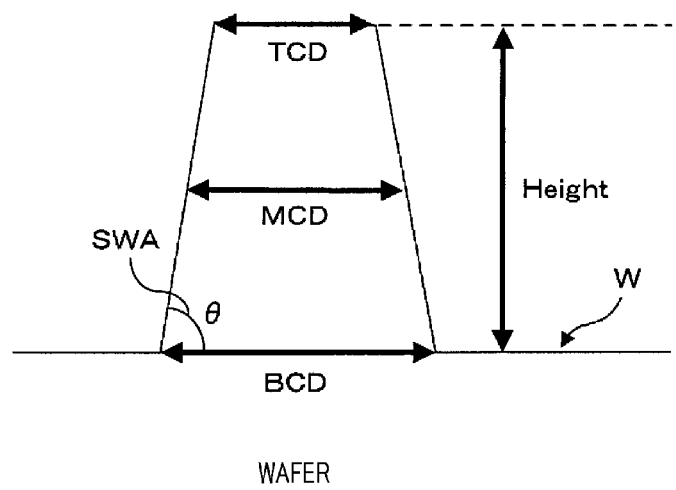
FIG. 3 is an explanatory diagram illustrating some of parameters used for calculating a model.

FIG. 3 is an explanatory diagram illustrating some of parameters used for creating a model. FIG. 3 shows cross sections of the wafer W and the pattern. Parameters used for creating a model of a pattern includes a TCD (Top CD), a BCD (Bottom CD), a Height, a complex refractive index (N), and a film thickness (d). Herein, the complex refractive index (N) is a previously measured value. The complex refractive index (N) may be previously measured by the spectroscopic ellipsometer 1 or other devices than the spectroscopic ellipsometer 1.

The TCD and the BCD are line widths of the pattern. The TCD is a critical dimension of a top line, and the BCD is a critical dimension of a bottom line. Further, a MCD is the average of the TCD and the BCD. The Height is a height of the line formed by etching or a depth of a groove of the pattern.

A SWA (Side Wall Angle) as a sidewall angle of the line is calculated from the TCD, the BCD, and the Height. If the SWA is denoted as $\theta$, $\theta$ can be expressed by the following equation (2).

[Equation 2]

$$\tan\theta = \frac{\text{Height}}{\frac{1}{2} \times (BCD - TCD)} \qquad (2)$$

The film thickness (d) is a thickness of a film on the wafer W. In the illustrative embodiment depicted in FIG. 3, the film thickness (d) is equal to the Height. However, if a wafer W having thereon multi-layered films is etched, an etching process is not performed on a surface of the wafer W. Accordingly, the film thickness (d) becomes greater than the Height.

In the library 1L, an amplitude ratio ($\Psi$) and a phase difference ($\Delta$) of a model and a TCD, a BCD and a Height of the model are stored so as to be related to each other. The MCD or the SWA may be calculated from the measured TCD, BCD, and Height or may be stored by the previous calculation in the library 1L. Hereinafter, it will be described that the amplitude ratio ($\Psi$) and the phase difference ($\Delta$) of the model correspond to the TCD, the BCD, the Height, and the pre-calculated MCD or SWA to be stored in the library 1L.

The CPU 181 searches a model having a minimum value of the error function, which is obtained by differences between the measured amplitude ratio ($\Psi$) and phase difference ($\Delta$) and the amplitude ratio ($\Psi$) and phase difference ($\Delta$) stored in the library 1L. Then, the CPU 181 acquires a TCD, a BCD, a Height, a MCD, and a SWA of the model having the minimum value of the error function. The CPU 181 stores the acquired TCD, BCD, Height, MCD, and SWA in the storage unit 185.

The shape of the pattern may include a cone shape tapering to a top and a rounded-top shape. Further, the critical dimension and the shape of the pattern are not limited to the above description. By way of example, a critical dimension and a shape of a film, a hole, a protrusion, or a groove may be used. Further, a critical dimension and a shape of the hole may include a diameter of the hole, a depth of the hole, a pitch of the hole, an inclined angle of an inner wall of the hold, and curvature of the inner wall of the hole. In order to measure these critical dimensions and shapes, a model having a structure of a film, a hole, a protrusion, or a groove is created and stored in the library 1L.

Hereinafter, there will be explained measurement results of patterns respectively etched by using two focus rings each having a different using time in accordance with an illustrative embodiment.

Figure 4:
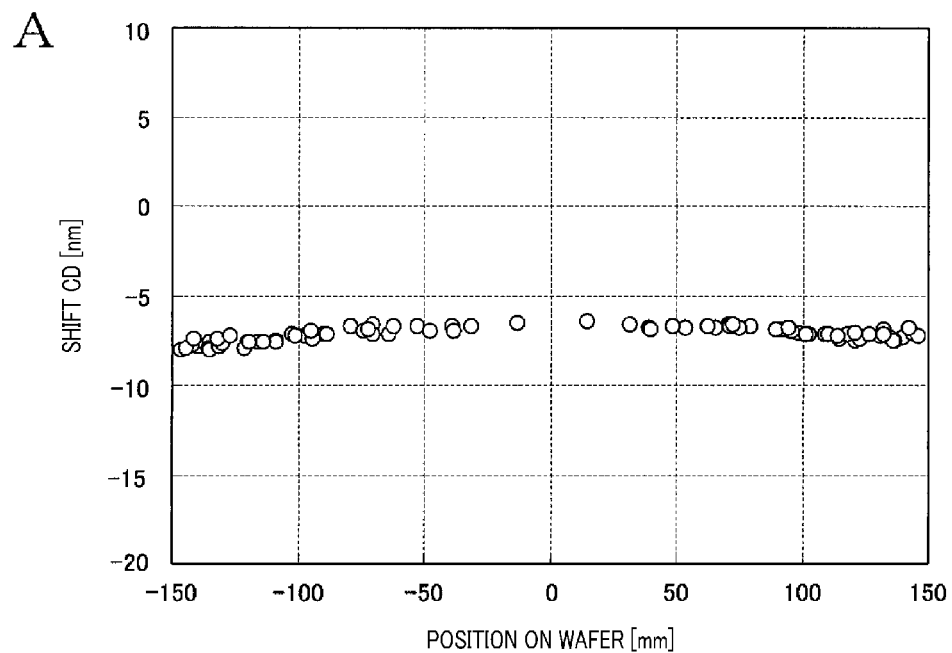
FIG. 4 is an explanatory diagram illustrating a measurement result of a line width of a pattern.
Figure 4:
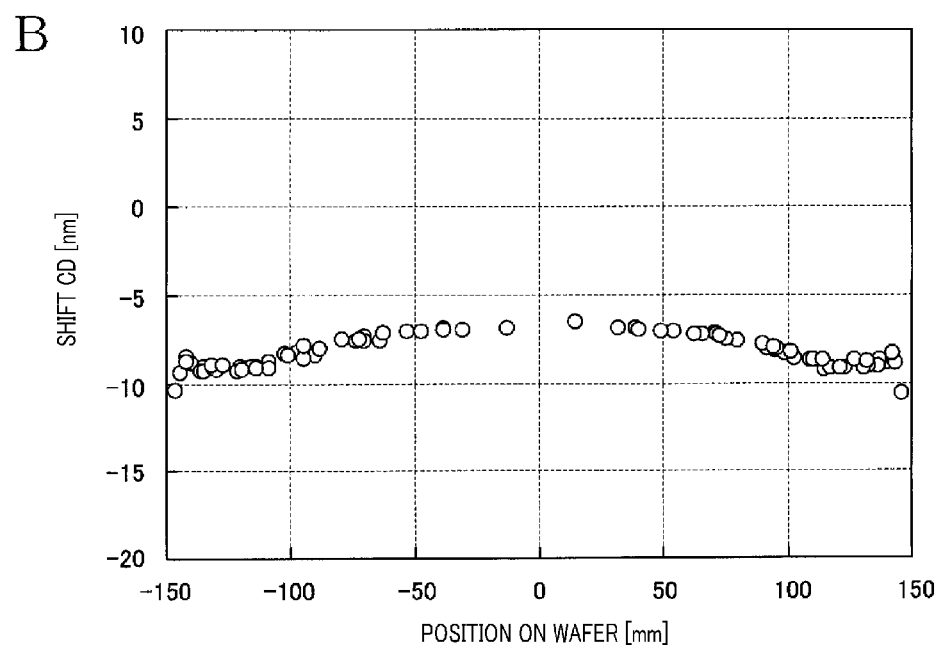

FIG. 4 is an explanatory diagram illustrating a measurement result of a line width of a pattern. FIG. 4(A) is a measurement result of a line width of a pattern etched by using a focus ring having a using time of less than about 10 hours. FIG. 4(B) is a measurement result of a line width of a pattern etched by using a focus ring having a using time of about 550 hours. A height of the focus ring is about 4.0 mm in FIG. 4(A) and about 3.1 mm in FIG. 4(B).

In FIGS. 4(A) and 4(B), a vertical axis represents a shift CD in nanometers (nm). Herein, the shift CD is a difference between a MCD after an etching process and a MCD before the etching process. When evaluating a deviation in line widths after the etching process, the evaluated result is influenced by line widths before the etching process. Therefore, in FIG. 4, in order to exclude any influence by the line widths before the etching process, the vertical axis represents the shift CD which is the MCD before the etching process minus the MCD after the etching process. The shift CD is effectively used for comparing differences in critical dimensions and shapes of patterns caused by a difference in erosion states of focus rings. In FIGS. 4(A) and 4(B), a horizontal axis represents a measurement position on the wafer W in millimeters (mm). In FIGS. 4(A) and 4(B), a position 0 mm on the horizontal axis is the center of the wafer W. Each position from the center of the wafer W to the peripheral portion thereof in a radial direction is represented as numerical values. Herein, the radius of the wafer W is about 150 mm.

From comparing FIG. 4(A) to FIG. 4(B), it can be seen that uniformity of the pattern in the surface of the wafer W is related to the using times of focus rings. When the focus ring having a using time of less than about 10 hours is used, the shift CD is substantially uniform regardless of the measurement position on the wafer W. Meanwhile, when the focus ring having a using time of about 550 hours is used, the shift CD is decreased from the center of the wafer W toward the peripheral portion thereof, and the shift CD is slightly increased around the peripheral portion. At an area of about 30 mm from the peripheral portion of the wafer W toward the center thereof, a difference of about 2 nm in the shift CD is observed.

Figure 5:
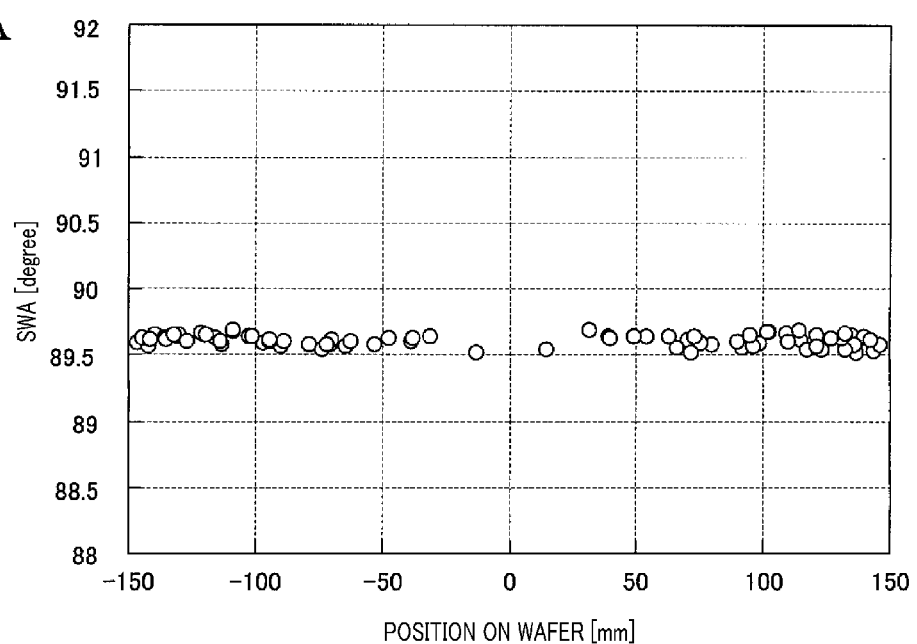
FIG. 5 is an explanatory diagram illustrating a measurement result of a SWA of a pattern.
Figure 5:
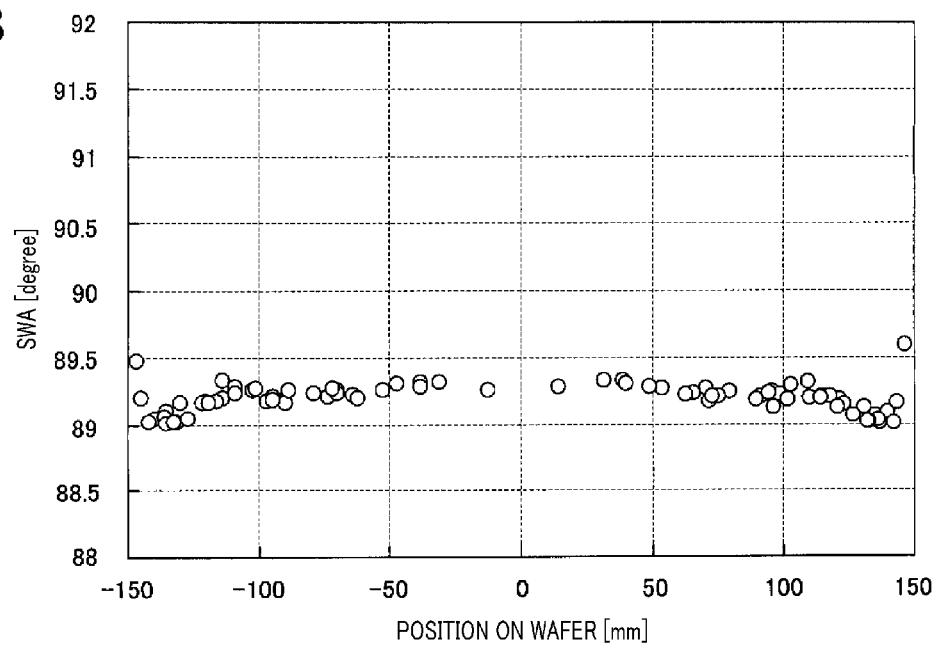

FIG. 5 is an explanatory diagram illustrating a measurement result of a SWA of a pattern. Focus rings of FIGS. 5(A) and 5(B) have the same conditions as the focus rings of FIGS. 4(A) and 4(B), respectively. In FIGS. 5(A) and 5(B), a vertical axis represents a SWA in degrees. In FIGS. 5(A) and 5(B), a horizontal axis is the same as that of FIGS. 4(A) and 4(B).

From comparing FIG. 5(A) to FIG. 5(B), it can be seen that when the focus ring having a using time of less than about 10 hours is used, the SWA is substantially uniform regardless of the measurement position on the wafer W. Meanwhile, when the focus ring having a using time of about 550 hours is used, uniformity of the SWA in the surface of the wafer W is decreased. At an area of about 10 mm to about 30 mm from the peripheral portion of the wafer W toward the center thereof, the SWA is decreased toward the peripheral portion. However, at the outermost periphery of the wafer W, the SWA is increased as compared with the inner side from the outermost periphery.

Figure 6:
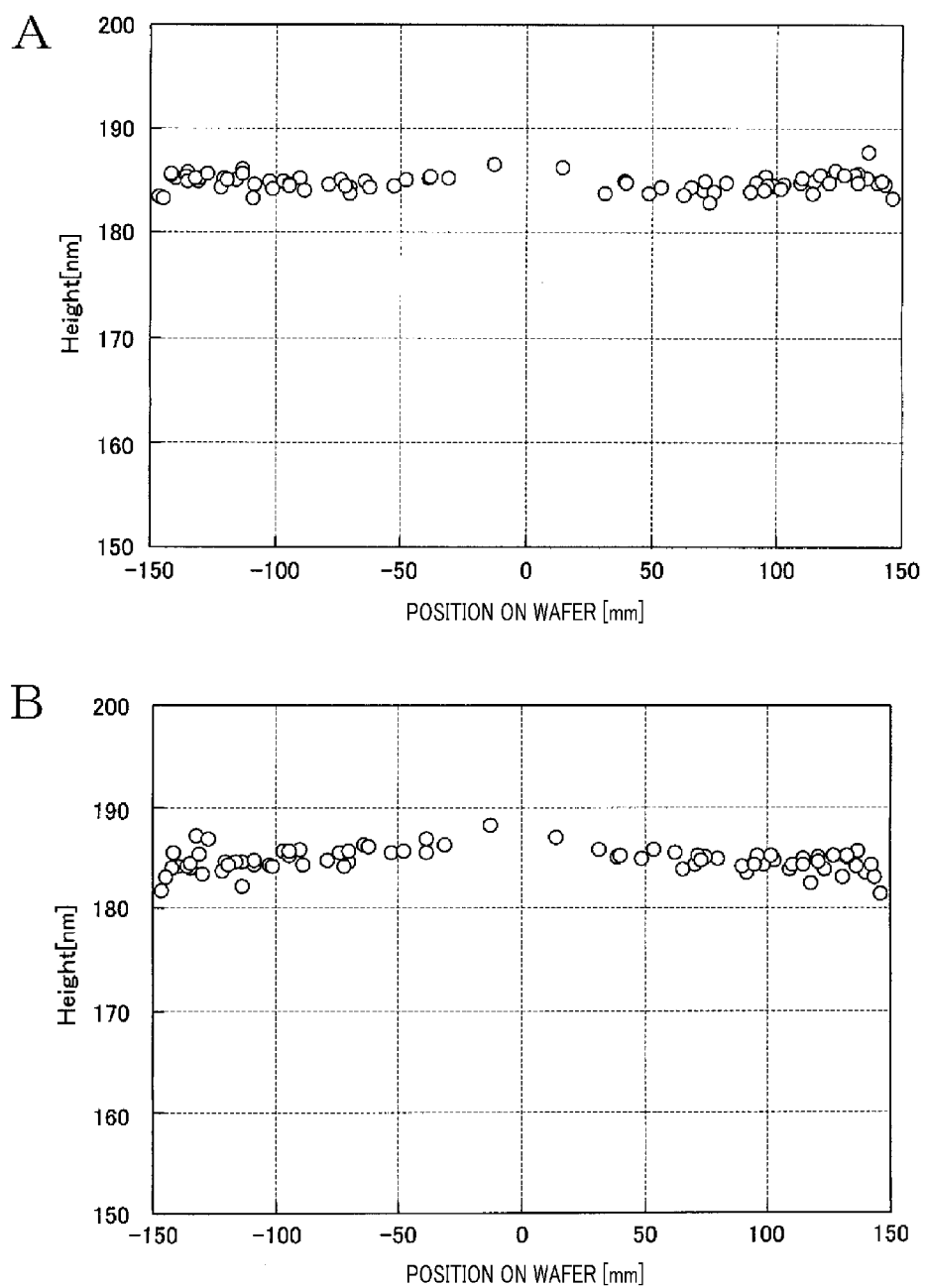
FIG. 6 is an explanatory diagram illustrating a measurement result of a Height of a pattern.

FIG. 6 is an explanatory diagram illustrating a measurement result of a Height of a pattern. Focus rings of FIGS. 6(A) and 6(B) have the same conditions as the focus rings of FIGS. 4(A) and 4(B), respectively.

In FIGS. 6(A) and 6(B), a vertical axis represents a Height in nanometers (nm). In FIGS. 6(A) and 6(B), a horizontal axis is the same as that of FIGS. 4(A) and 4(B). From comparing FIG. 6(A) to FIG. 6(B), it can be seen that the focus ring having a using time of less than about 10 hours is used, a difference in the Heights at the measurement positions on the wafer W is observed, but uniformity of the Height in the surface of the wafer W is not decreased. Meanwhile, when the focus ring having a using time of about 550 hours is used, uniformity of the Height in the surface of the wafer W is decreased. In this case, the Height is shown to be decreased from the center of the wafer W toward the peripheral portion thereof. At an area of about 30 mm from the peripheral portion of the wafer W toward the center thereof, a difference in the Heights is increased as compared with other areas.

It can be seen from the above-described measurement results that deviations in the measurement values of the critical dimension and the shape of the pattern etched by using the focus ring having the using time of about 550 hours are increased at an area of about 50 mm from the peripheral portion of the wafer W toward the center thereof. Therefore, the focus ring may be replaced when a deviation in the shift CDs at the area of about 50 mm from the peripheral portion of the wafer W toward the center thereof is greater than, for example, about 1 mm.

Further, the focus ring may be replaced when a deviation in the SWAs at the area of about 50 mm from the peripheral portion of the wafer W to the center thereof is greater than, for example, about 0.15 degrees. Furthermore, the focus ring may be replaced when a deviation in the Heights at the area of about 50 mm from the peripheral portion of the wafer W to the center thereof is greater than, for example, about 6 nm.

Moreover, a measured area on the pattern for determining whether or not to replace may be a range of from about 10 mm to about 30 mm from the peripheral portion of the wafer W toward the center thereof.

The above-described deviations are differences between the maximum values and the minimum values from the measurement values, i.e. a range of data. As the deviation, a variance, a standard deviation, an unbiased variance, or an average deviation may be used. The critical dimension to be measured may include a TCD and a BCD.

The CPU 181 calculates deviations of all measurement values of the TCD, BCD, Height, MCD, and SWA from those stored in the storage unit 185. Further, the CPU 181 calculates deviations in the measurement values at the area of about 50 mm from the peripheral portion of the wafer W toward the center thereof. Furthermore, the CPU 181 calculates deviations in the measurement values at the area of about 50 mm to about 100 mm from the peripheral portion of the wafer W toward the center thereof. The CPU 181 stores the calculated deviations in the measurement values in the storage unit 185.

The CPU 181 compares the calculated deviations to the critical values previously stored in the storage unit 185. If the calculated deviations are greater than the critical values, the CPU 181 displays a message of replacement of the focus ring on the display unit 184.

Figure 7:
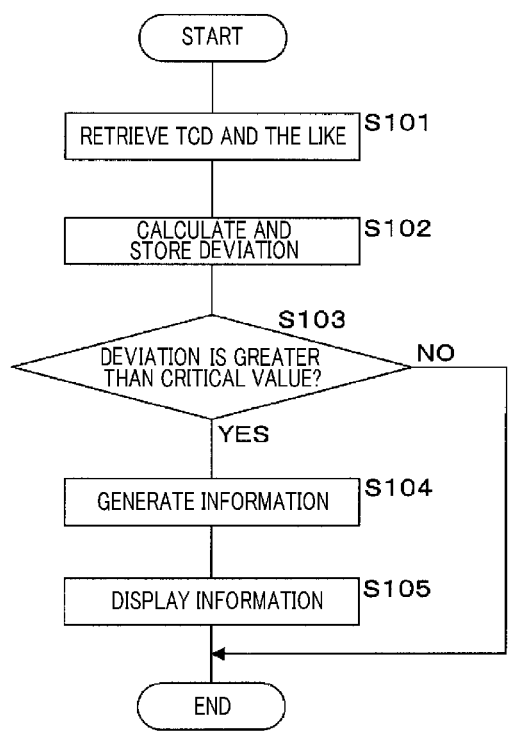
FIG. 7 is a flowchart illustrating a process of notifying replacement of a focus ring.

FIG. 7 is a flowchart illustrating a process of notifying replacement of a focus ring. The TCDs, BCDs, Heights, MCDs, and SWAs measured at each measurement position are stored in the storage unit 185.

The CPU 181 retrieves the TCDs, BCDs, Heights, MCDs, and SWAs from the storage unit 185 (process S101). In process S101, if the TCDs and BCDs before and after the etching process are stored in the storage unit 185, the CPU 181 may obtain shift CDs of the TCDs and the BCD. Alternatively, the CPU 181 may obtain a shift CD of the MCDs.

The CPU 181 calculates deviations of the TCDs, BCDs, Heights, MCDs, and SWAs and stores the calculated deviations in the storage unit 185 (process S102). In process S102, the CPU 181 may calculate the deviations in the measurement values obtained from the entire area of the wafer W or in the measurement values obtained from a specific area. Further, the CPU 181 may calculate the deviations in the measurement values obtained from a multiple number of specific areas.

The CPU 181 determines whether or not the calculated deviations are greater than the critical values (process S103). If the CPU 181 determines that the calculated deviations are not greater than the critical values (process S103: NO), the CPU 181 ends the process. Meanwhile, if the CPU 181 determines that the calculated deviations are greater than the critical values (process S103: YES), the CPU 181 generates information of a replacement time of the focus ring (process S104). The information generated by the CPU 181 in process S104 is, for example, a message for informing replacement of the focus ring. In process S104, the CPU 181 may generate audio data for informing replacement of the focus ring. The CPU 181 displays the generated information on the display unit 184 (process S105) and ends the process.

When a cumulative etched time of the focus ring reaches a reference time, the focus ring is replaced. However, in such case, the focus ring is replaced without monitoring an erosion state of the focus ring. For this reason, if the focus ring is replaced even when the focus ring is still usable, costs is wasted.

If the cumulative etched time of the focus ring does not reach the reference time for replacement even when the focus ring is badly eroded, the focus ring is not replaced. In this case, uniformity in the surface of the wafer W after the etching process may not be assured. Consequentially, a target characteristic required for a semiconductor device as a final product may not be acquired. In most cases, since various kinds of etching recipes (not a single kind of an etching recipe) are set for the plasma processing apparatus, the erosion state of the focus ring may not be uniform. For this reason, there is a limit to the replacement of the focus ring depending on the reference time.

In the spectroscopic ellipsometer 1, a critical dimension and a shape of a pattern on a product wafer W can be measured accurately in a short time. Due to the erosion of the focus ring, uniformity of the pattern in the surface of the wafer W is decreased. Thus, by monitoring uniformity of the pattern in the surface of the wafer W, the spectroscopic ellipsometer 1 can accurately determine a replacement time of the focus ring.

As one of parameters, uniformity of a line width in the surface of the wafer W may be measured by using a CD-SEM (Scanning Electron Microscope).

However, since the CD-SEM measures a line width from a normal direction of the wafer W, a cross sectional shape of the pattern may not be measured. Measurement accuracy and a measurement time of the CD-SEM may not be sufficient in consideration of a required quality of the pattern and manufacturing costs. Further, the pattern is damaged by electron beams irradiated onto the pattern by the CD-SEM.

Figure 8:
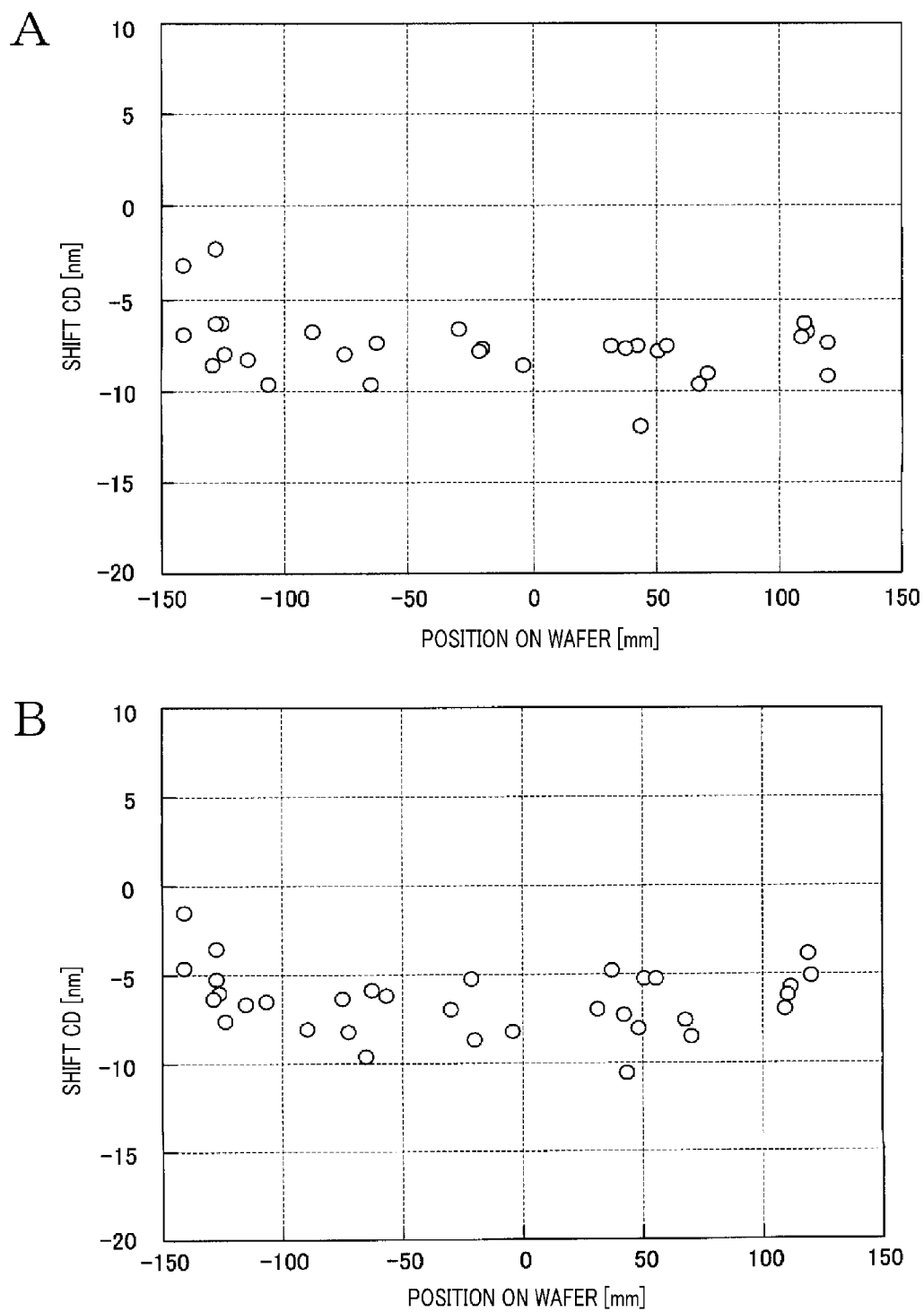
FIG. 8 is an explanatory diagram illustrating a measurement result of a line width of a pattern.

FIG. 8 is an explanatory diagram illustrating a measurement result of a line width of a pattern. FIG. 8 shows distribution of shift CDs measured by the CD-SEM with respect to the same sample as used in FIG. 4. Focus rings of FIGS. 8(A) and 8(B) have the same conditions as the focus rings of FIGS. 4(A) and 4(B), respectively. A vertical axis and a horizontal axis of FIGS. 8(A) and 8(B) are the same as the vertical axis and the horizontal axis of FIGS. 4(A) and 4(B), respectively.

From comparing FIGS. 8(A) and 8(B) to FIGS. 4(A) and 4(B), it can be seen that the measurement accuracy of the shift CDs measured by the spectroscopic ellipsometer 1 is remarkably higher than the measurement accuracy of the shift CDs measured by the CD-SEM. In FIG. 8, since a deviation in the measurement values is much greater than a deviation in the shift CDs of the pattern, a change of the shift CDs in the surface of the wafer W cannot be observed.

It can be seen from FIGS. 4 and 8 that spectroscopic ellipsometer 1 has an excellent effect to determine whether or not to replace the focus ring. Further, the spectroscopic ellipsometer 1 can measure the shape of the pattern in a nondestructive manner.

A replacement time of the focus ring can be determined based on the deviation in measurement values of the critical dimension or the shape of the pattern, and also the measurement values of the critical dimension or the shape of the pattern. By way of example, if a BCD or a SWA in the peripheral portion of the wafer W is greater than a certain critical value, the CPU 181 may determine that it is time to replace the focus ring.

Second Illustrative Embodiment

In a second illustrative embodiment, based on a critical dimension or a shape of a pattern measured by the spectroscopic ellipsometer 1, a feedback control of a temperature of a focus ring provided in a plasma processing apparatus is performed.

Figure 9:
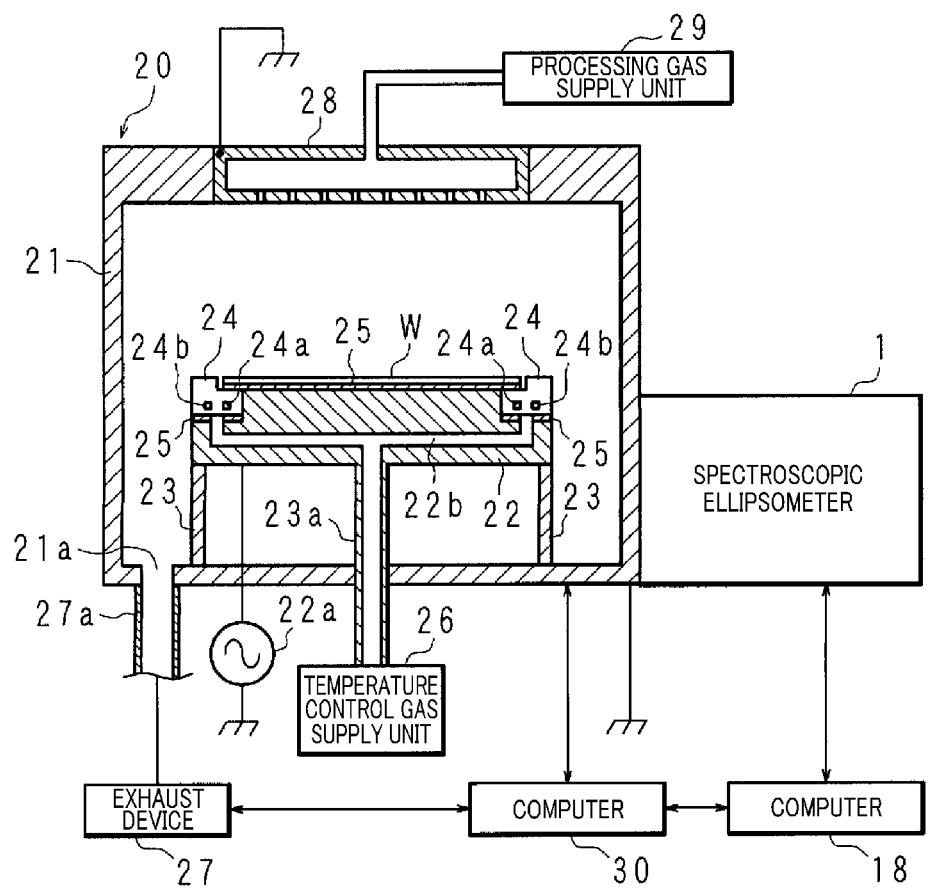
FIG. 9 is an explanatory diagram illustrating a configuration example of a substrate processing system.

FIG. 9 is an explanatory diagram illustrating a configuration example of a substrate processing system 2. The substrate processing system (pattern forming system) 2 includes a substrate processing apparatus and the spectroscopic ellipsometer 1. The substrate processing apparatus is, for example, a plasma processing apparatus (pattern forming apparatus) 20. The plasma processing apparatus 20 performs an etching process onto a film on the wafer W, and a pattern is formed on the wafer W. The plasma processing apparatus 20 is connected to the spectroscopic ellipsometer 1 via a shutter (not illustrated) through which the wafer W is transferred. The etched wafer W is transferred from the plasma processing apparatus 20 to the spectroscopic ellipsometer 1 by a non-illustrated transfer device. The spectroscopic ellipsometer 1 measures a critical dimension and a shape of the pattern formed by the plasma processing apparatus 20.

The plasma processing apparatus 20 includes a processing vessel (chamber) 21, a susceptor 22, a support 23, a focus ring 24, an electrostatic chuck 25, a temperature control gas supply unit 26, an exhaust device 27, a shower head 28, a processing gas supply unit 29, and a computer 30.

The processing vessel 21 has a cylinder shape and is made of metal such as aluminum and stainless steel. The processing vessel 21 is frame-grounded.

The susceptor 22 is a disk-shaped mounting table for mounting thereon the wafer W. The susceptor 22 is provided within the processing vessel 21. The susceptor 22 is connected to a high frequency power supply 22a and serves as a lower electrode. Formed within the susceptor 22 is a gas passage 22b extended from a central portion of a bottom surface of the susceptor 22 to an upper peripheral surface thereof.

The support 23 is a cylindrical member extended from a bottom surface of the processing vessel 21 and configured to support the susceptor 22.

The focus ring 24 is a ring-shaped member having an inner diameter greater than a diameter of the wafer W. The focus ring 24 is mounted on the upper peripheral surface of the susceptor 22. The focus ring 24 is provided in order to prevent a difference in etching rates at different portions of the pattern formed on the wafer W. Further, the focus ring 24 is provided to increase uniformity of the pattern in the surface of the wafer W. The focus ring 24 is made of, for example, Si, SiC, C (glassy carbon), $SiO_2$, or $Al_2O_3$.

Within the focus ring 24, a temperature sensor 24a and a heater 24b are embedded. The temperature sensor 24a transmits a measured temperature of the focus ring 24 as a signal to the computer 30. A power is supplied to the heater 24b from a non-illustrated power supply, and the focus ring 24 is heated by the heater 24b.

The electrostatic chuck 25 is provided on an upper surface of the susceptor 22 on which the wafer W is mounted and also provided on an upper surface of the susceptor 22 in contact with a bottom surface of the focus ring 24. The wafer W and the focus ring 24 are attracted to the susceptor by the electrostatic chuck 25. In the electrostatic chuck 25 in contact with the focus ring 24, an opening is formed so as to communicate with the gas passage 22b extended upwards from the bottom of the susceptor 22.

Provided at an inside of the support 23 is a gas inlet line 23a passing through the bottom surface of the processing vessel 21 so as to reach the gas passage 22b within the susceptor 22.

The temperature control gas supply unit 26 stores therein a temperature control gas for cooling the focus ring 24. Herein, the temperature control gas is a thermal conductive gas such as a He (helium) gas. The temperature control gas supply unit 26 is connected to the gas inlet line 23a.

The temperature control gas discharged from the temperature control gas supply unit 26 to the gas inlet line 23a is supplied to an interface between the electrostatic chuck 25 and the focus ring 24 via the gas passage 22b. In this way, the focus ring 24 is cooled by the temperature control gas.

The exhaust device 27 is connected to an exhaust port 21a formed in a bottom portion of the processing vessel 21 via an exhaust line 27a. The exhaust device 27 includes a high vacuum pump such as an entrapment cryopump or a turbo molecular pump, and an inside of the processing vessel 21 is depressurized to a certain pressure level.

The shower head 28 is provided at a ceiling of the processing vessel 21, and a processing gas is introduced from the processing gas supply unit 29 to the processing vessel 21 through the shower head 28. The shower head 28 serves as an upper electrode and is electrically grounded. The processing gas is excited into plasma in a space between the shower head 28 and the susceptor 22. The film on the wafer W is etched by the plasma of the processing gas. Generally, as the processing gas, a mixture gas of various kinds of gases is used.

Figure 10:
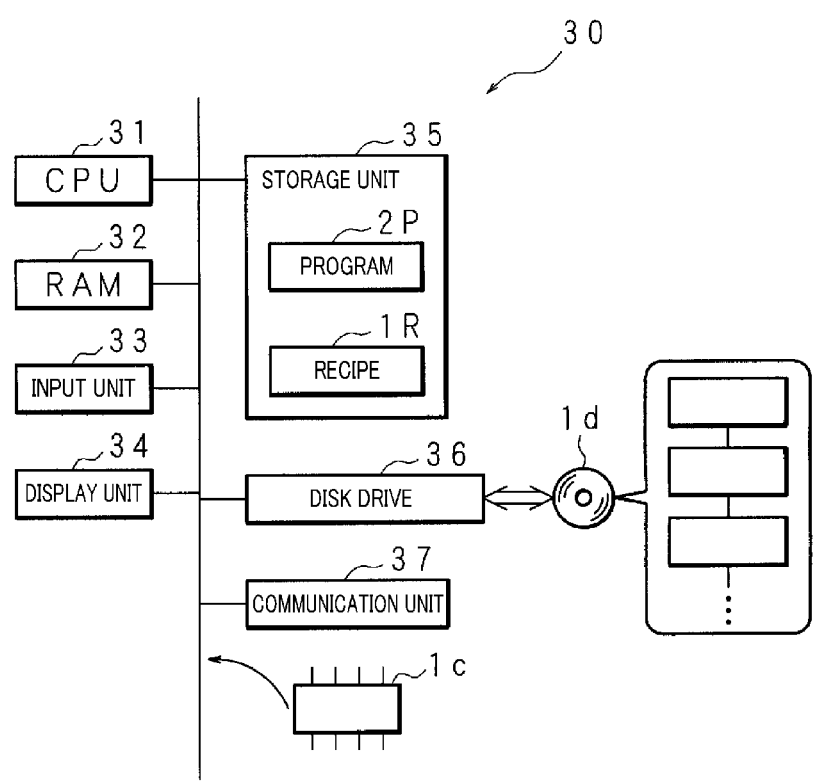
FIG. 10 is a block diagram of a configuration example of a computer.

FIG. 10 is a block diagram of a configuration example of the computer 30. The computer 30 includes a CPU (control unit) 31, a RAM 32, an input unit 33, a display unit 34, a storage unit 35, a disk drive 36, and a communication unit (receiving unit) 37.

The CPU 31 is connected to each component of hardware of the computer 30 via a bus. The CPU 31 controls each component of hardware and performs various software processes according to various programs stored in the storage unit 35.

The CPU 31 controls the heater 24b to heat the focus ring 24. Further, the CPU 31 controls a non-illustrated valve provided at the gas inlet line 23a, and the focus ring 24 is cooled.

The RAM 32 is a semiconductor device. The RAM 32 writes and reads out necessary information in response to instructions of the CPU 31. The input unit 33 is an input device such as a keyboard, a mouse, or a touch panel. The display unit 34 is, for example, a liquid crystal display or an organic EL display.

The storage unit 35 is, for example, a hard disk or a mass memory, and a recipe 1R and a program 2P is previously stored in the storage unit 35. The recipe 1R is data for specifying a process sequence of a certain process to be performed by the plasma processing apparatus 20. The recipe 1R includes one or more processes, and a processing condition for each process is previously set as a parameter. By way of example, the parameter includes a temperature of the focus ring 24, process temperature, a process pressure, a gas flow rate, and a processing time.

The CPU 31 executes the program 2P, and a process to be performed by the plasma processing apparatus 20 is controlled according to the recipe 1R under the control of the CPU 31. The program 2P includes a process of controlling a temperature of the focus ring 24 based on a signal from the spectroscopic ellipsometer 1.

The disk drive 36 reads out information from an optical disk 1d as an external storage medium such as a CD, a DVD, or a BD and records information in the optical disk 1d.

The communication unit 37 is an interface to communicate with the computer 18 of the spectroscopic ellipsometer 1. The communication unit 37 may be connected with a LAN, Internet, or a telephone line.

Hereinafter, an operation of the substrate processing system 2 will be explained.

The wafer W having thereon an organic film coated with a photoresist is mounted on the susceptor 22 by the non-illustrated transfer device. The wafer W is mounted on the susceptor 22 via the electrostatic chuck 25 so as not to be in contact with the focus ring 24 or mounted on the focus ring 24. The wafer W and the focus ring 24 are attracted to the susceptor 22 by the electrostatic chuck 25.

A mixed gas as the processing gas is introduced from the processing gas supply unit 29 into the processing vessel 21 at a certain flow rate and a certain flow rate ratio. An internal pressure of the processing vessel 21 is controlled to be a certain pressure level by the exhaust device 27. The temperature of the focus ring 24 is set by the CPU 31 according to the recipe 1R. Until the spectroscopic ellipsometer 1 starts to measure the pattern, the temperature of the focus ring 24 may not be controlled.

When a voltage is applied to the susceptor 22 from the high frequency power supply 22a, the processing gas is dissociated, and plasma of the processing gas is generated. The organic film on the wafer W is etched by the plasma, and the pattern is formed.

The shutter between the plasma processing apparatus and the spectroscopic ellipsometer 1 is opened. The etched wafer W is transferred from the plasma processing apparatus 20 into the spectroscopic ellipsometer 1 by a non-illustrated transfer device. The spectroscopic ellipsometer 1 measures a critical dimension and a shape of the pattern formed by the plasma processing apparatus 20.

The CPU 181 of the computer 18 determines whether or not a deviation in measurement values of the critical dimension or the shape is greater than a critical value.

Herein, the critical value is a reference value for determining whether or not to control the temperature of the focus ring 24 of the plasma processing apparatus 20. This critical value may be the same as or different from the critical value described in the first illustrative embodiment. If this critical value is the same as the critical value described in the first illustrative embodiment, the focus ring 24 is continuously used without being replaced while its temperature is controlled through a feedback control. Thus, a life span of the focus ring 24 is increased. By way of example, if this critical value is smaller than the critical value described in the first illustrative embodiment, the focus ring 24 does not need to be replaced, and the temperature of the focus ring 24 is controlled through a feedback control in order to increase uniformity of the pattern in the surface of the wafer W.

The deviation used for comparing with the critical value may be a deviation obtained from the entire area of the wafer W or a specific area of the wafer W. By way of example, a deviation obtained from the peripheral portion of the wafer W may be compared to the critical value.

As the deviation, a range of data, a variance, a standard deviation, an unbiased variance, or an average deviation may be used. The critical value is previously stored in the storage unit 185.

If a calculated deviation is greater than a certain critical value, the CPU 181 transmits information of the deviation in the pattern to the computer 30 of the plasma processing apparatus 20. Upon receiving the information from the computer 18 by the CPU 31 of the computer 30, the CPU 31 retrieves a new etching condition from the recipe 1R based on the received information of the deviation. The CPU 31 sets the newly retrieved etching condition for the plasma processing apparatus 20. Thus, the temperature of the focus ring 24 is adjusted to a temperature different from or the same as the previous temperature according to the new etching condition.

Here, in the recipe 1R of the storage unit 35, the deviation in the pattern and the etching condition including the temperature of the focus ring 24 are previously stored so as to be related to each other. By way of example, in the recipe 1R, a certain deviation and an etching condition capable of reducing the certain deviation is stored so as to be related to each other.

Further, the CPU 181 displays the deviation in the pattern on the display unit 184. The etching condition including the temperature of the focus ring 24 may be manually set for the plasma processing apparatus 20 by a user.

The CPU 31 monitors the temperature of the focus ring checked by the temperature sensor 24a, and the temperature of the focus ring 24 is controlled by the heater 24b or the temperature control gas under the control of the CPU 31. The CPU 31 controls other conditions (for example, a process temperature, a process pressure, a gas flow rate, and a processing time) besides the temperature of the focus ring 24 according to the new etching condition.

The temperature of the focus ring 24 may be controlled by the CPU 31 to be uniform or to be varied from a start of the etching process to an end thereof.

Figure 11:
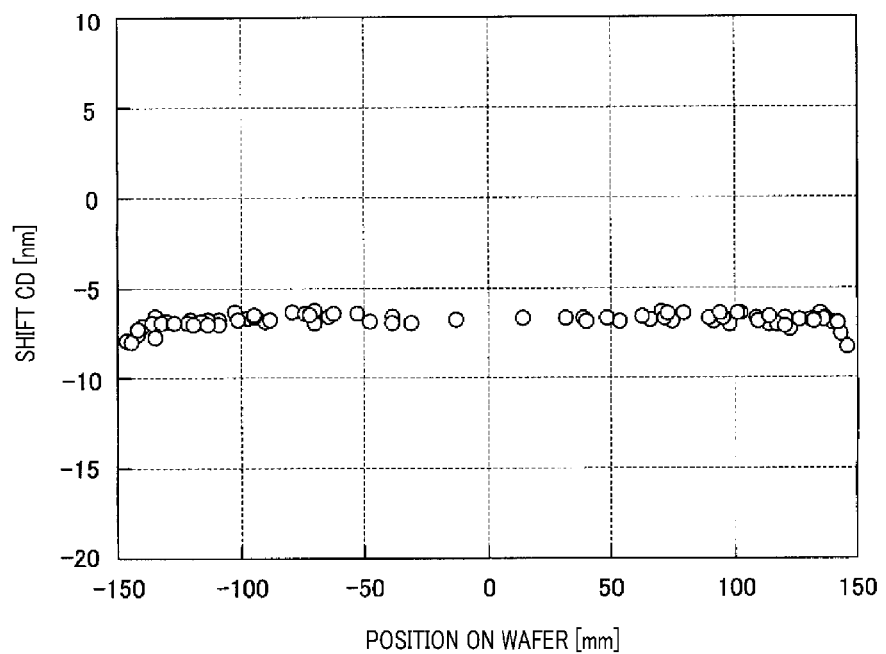
FIG. 11 is an explanatory diagram illustrating a measurement result of a line width of a pattern.
Figure 11:
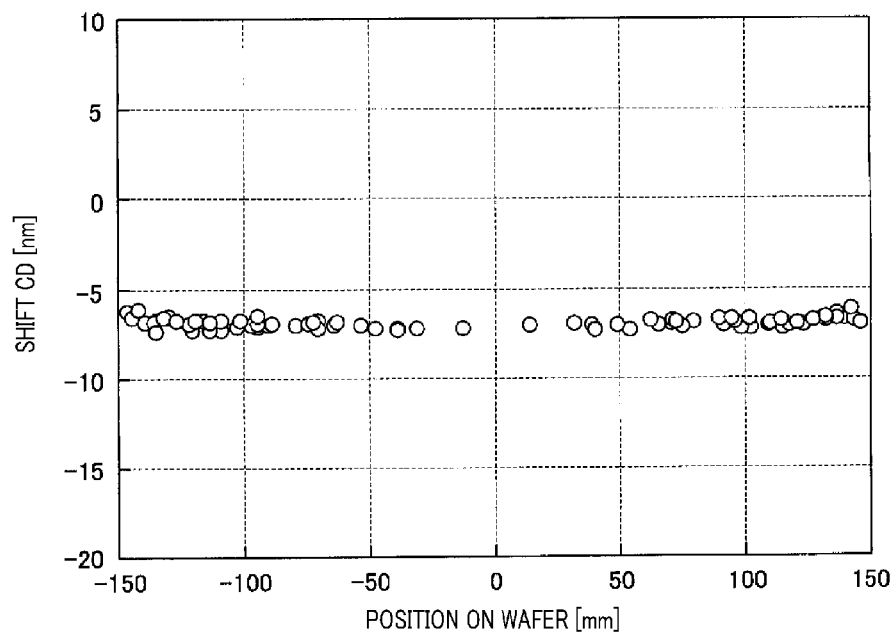

FIG. 11 is an explanatory diagram illustrating a measurement result of a line width of a pattern. FIGS. 11(A) and 11(B) show measurement results of a line width of a pattern etched by using the focus ring 24 having a using time of less than about 10 hours. A temperature of the focus ring 24 is about 37.2° C. in FIG. 11(A) and about 66.2° C. in FIG. 11(B).

In FIGS. 11(A) and 11(B), a vertical axis represents a shift CD in nanometers (nm). Herein, the shift CD shown in FIGS. 11(A) and 11(B) is the same as that of FIGS. 4(A) and 4(B). In FIGS. 11(A) and 11(B), a horizontal axis represents a measurement position on the wafer W in millimeters (mm). That is, the vertical axis and the horizontal axis shown in FIGS. 11(A) and 11(B) is the same as those of FIGS. 4(A) and 4(B).

From comparing FIG. 11(A) with FIG. 11(B), it can be seen that uniformity of the shift CD in the surface of the wafer W is slightly higher when the focus ring 24 of the higher temperature is used. By way of example, when the focus ring 24 of the lower temperature is used as depicted in FIG. 11(A), the shift CD is decreased by about 2 nm at an area of about 10 mm from the peripheral portion of the wafer W toward the center thereof as compared to the other areas of the wafer W.

Figure 12:
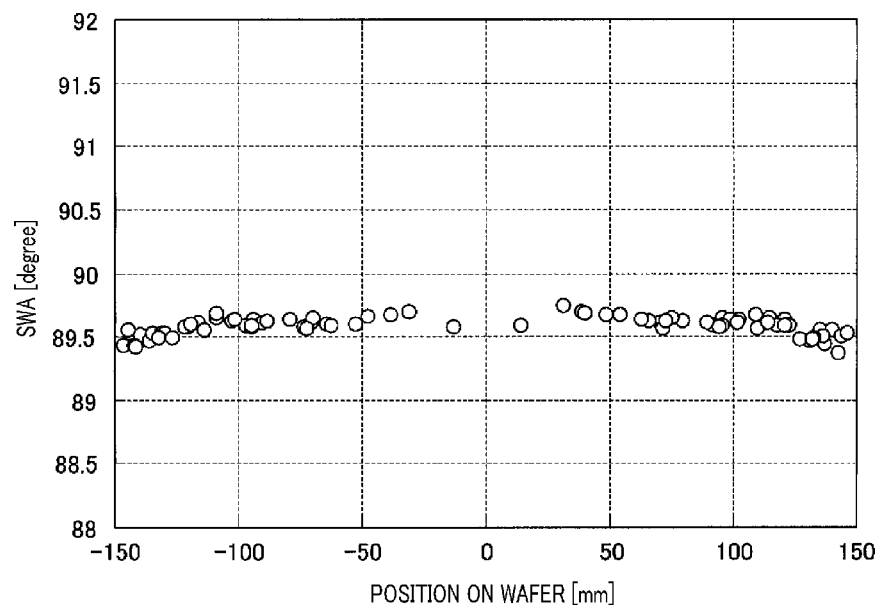
FIG. 12 is an explanatory diagram illustrating a measurement result of a SWA of a pattern.
Figure 12:
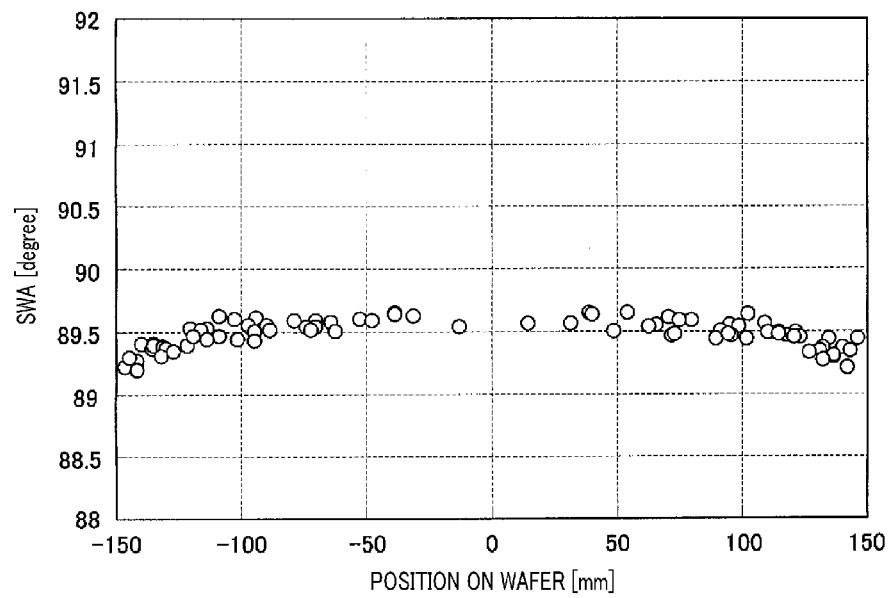

FIG. 12 is an explanatory diagram illustrating a measurement result of a SWA of a pattern. Focus rings of FIGS. 12(A) and 12(B) have the same temperature conditions as the focus rings of FIGS. 11(A) and 11(B), respectively. In FIGS. 12(A) and 12(B), a vertical axis represents a SWA in degrees. In FIGS. 12(A) and 12(B), a horizontal axis represents a measurement position on the wafer W in millimeters (mm). That is, the vertical axis and the horizontal axis shown in FIGS. 12(A) and 12(B) are the same as those of FIGS. 5(A) and 5(B), respectively.

From comparing FIG. 12(A) to FIG. 12(B), it can be seen that uniformity of the SWA in the surface of the wafer W is higher when the focus ring 24 of the lower temperature is used. When the focus ring 24 of the higher temperature is used as depicted in FIG. 12(B), the SWA is decreased by about 0.3 degrees at an area of about 50 mm from the peripheral portion of the wafer W toward the center thereof as compared to the other areas of the wafer W. Meanwhile, when the focus ring 24 of the lower temperature is used as depicted in FIG. 12(A), uniformity of the SWA in the surface of the wafer W is high, and a sidewall of the line is nearly vertical at the area of about 50 mm from the peripheral portion of the wafer W toward the center thereof.

Figure 13:
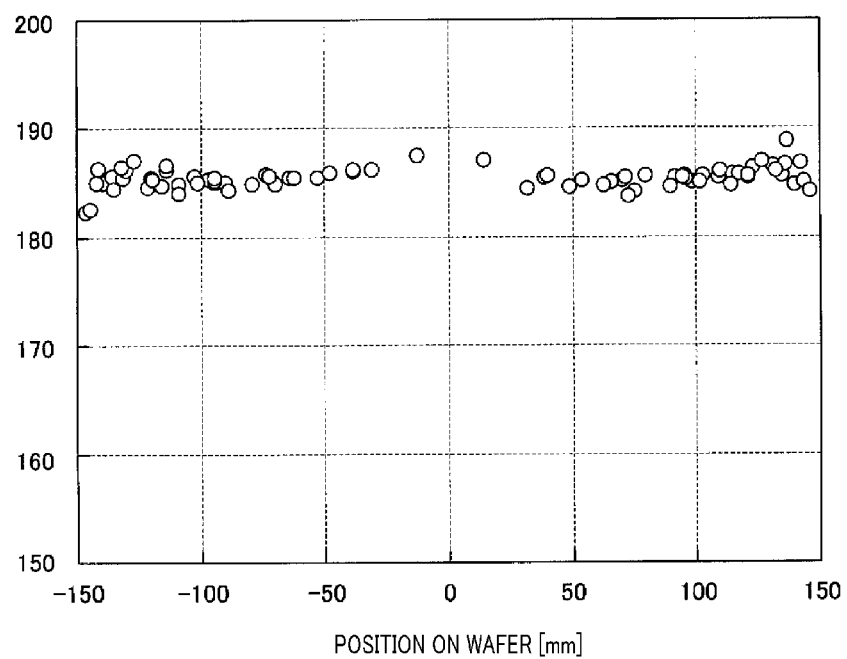
FIG. 13 is an explanatory diagram illustrating a measurement result of a Height of a pattern.
Figure 13:
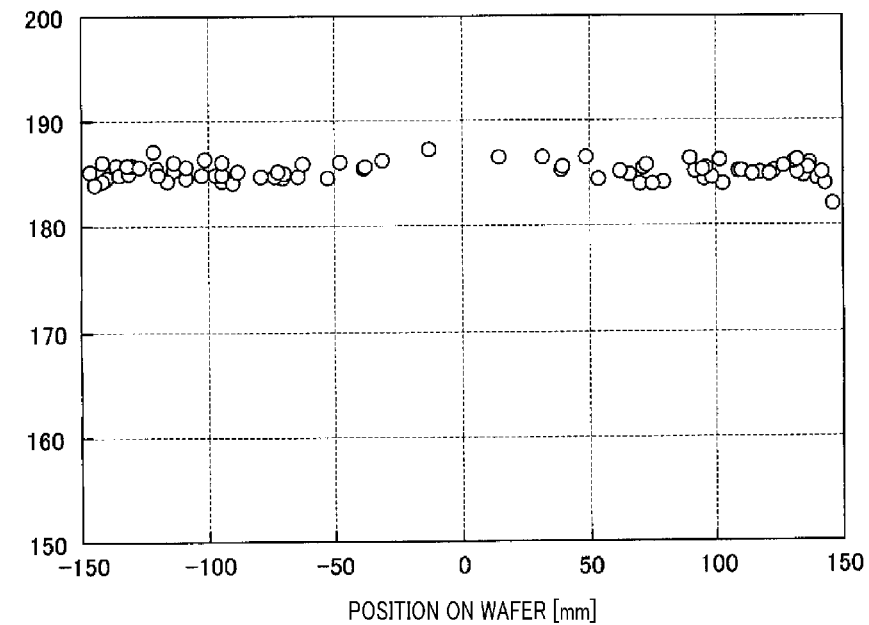

FIG. 13 is an explanatory diagram illustrating a measurement result of a Height of a pattern. Focus rings of FIGS. 13(A) and 13(B) have the same temperature conditions as the focus rings of FIGS. 11(A) and 11(B), respectively. In FIGS. 13(A) and 13(B), a vertical axis represents a Height in nanometers. In FIGS. 13(A) and 13(B), a horizontal axis represents a measurement position on the wafer W in millimeters (mm). That is, the vertical axis and the horizontal axis shown in FIGS. 13(A) and 13(B) are the same as those of FIGS. 6(A) and 6(B), respectively.

From comparing FIG. 13(A) to FIG. 13(B), it can be seen that a difference in uniformity of Heights in the surface of the wafer W is not caused by a difference in temperatures of the focus ring 24.

From the measurement results, it can be clearly seen that a temperature of the focus ring 24 is relevant to uniformity of the pattern in the surface of the wafer W. However, it may not be sufficient to simply increase or decrease a temperature of the focus ring 24 in order to increase uniformity of the pattern in the surface of the wafer W. Depending on parameters regarding a critical dimension or a shape of the pattern, the higher temperature may be required or the lower temperature may be required. By way of example, in order to increase the entire uniformity of the pattern in the surface of the wafer W shown in FIGS. 11, 12 and 13, the temperature of the focus ring 24 may be varied between about 37.2° C. and about 66.2° C.

FIGS. 11, 12 and 13 show experimental examples. Etching conditions are various. In the recipe 1R, deviations of a critical dimension and a shape of the pattern and an etching condition such as a temperature of the focus ring 24 or other parameters capable of reducing the deviation are stored so as to be related to each other.

Figure 14:
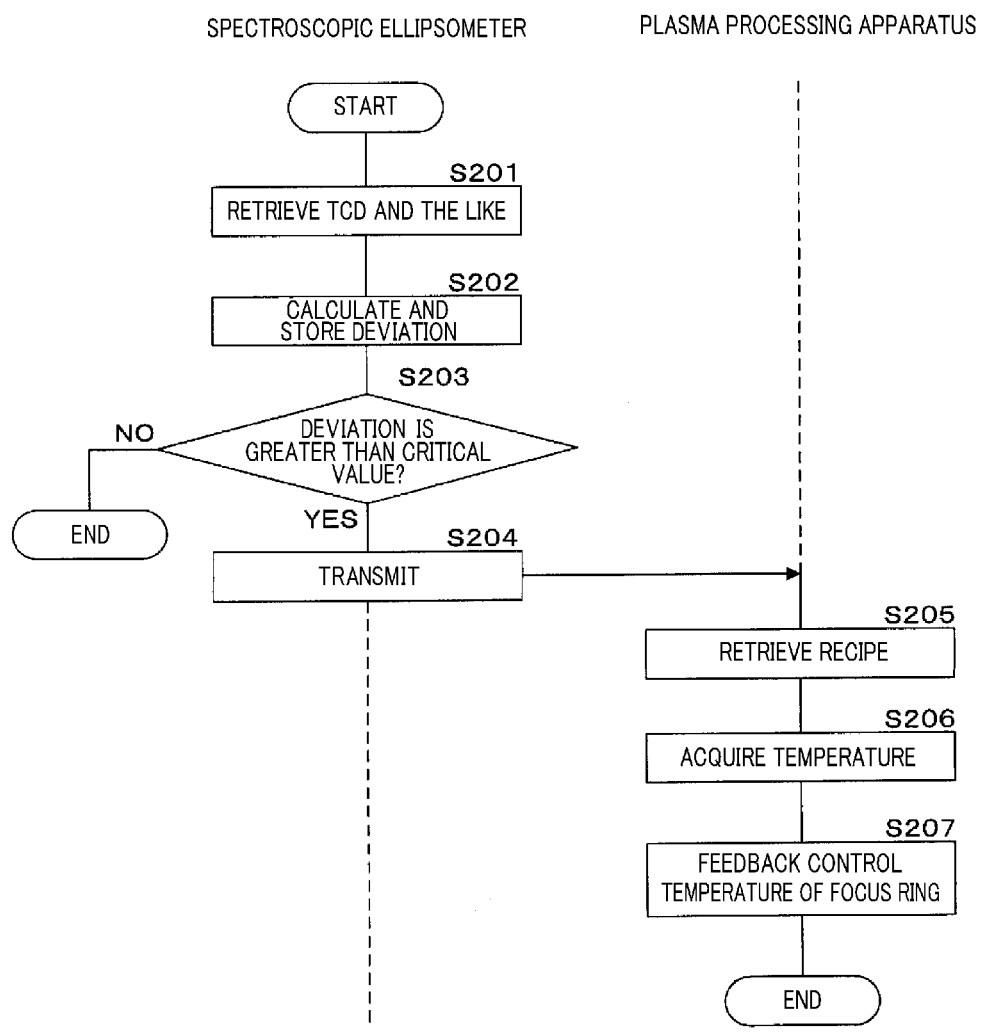
FIG. 14 is a flowchart illustrating a process sequence of controlling a temperature of a focus ring.

FIG. 14 is a flowchart illustrating a process sequence of controlling a temperature of the focus ring 24. Here, TCDs, BCDs, Heights, MCDs, and SWAs of the pattern are stored in the storage unit 185.

The CPU 181 of the spectroscopic ellipsometer 1 retrieves the TCDs, BCDs, Heights, MCDs, and SWAs from the storage unit 185 (process S201). The CPU 181 calculates deviations in the TCDs, BCDs, Heights, MCDs, and SWAs and stores the calculated deviations in the storage unit 185 (process S202).

The CPU 181 determines whether or not the calculated deviations are greater than the critical values (process S203). If the CPU 181 determines that the calculated deviations are not greater than the critical values (process S203: NO), the CPU 181 ends the process. If the CPU 181 determines that the calculated deviations are greater than the critical values (process S203: YES), the CPU 181 transmits information of the deviations to the plasma processing apparatus 20 (process S204).

The CPU 31 of the plasma processing apparatus 20 receives the information of the deviations and searches the recipe 1R based on the received deviations (process S205). The CPU 31 acquires a new temperature of the heated focus ring 24 (process S206). The CPU 31 performs a feedback control of the temperature of the focus ring 24 based on the newly acquired temperature (process S207) and ends the processes.

In accordance with the substrate processing system 2, a feedback control of the temperature of the focus ring 24 is performed based on a deviation in the critical dimension or the shape of the pattern on the wafer W. By performing a feedback control of the temperature of the focus ring 24, uniformity of the pattern in the surface of the wafer W can be increased. As a result, a life span of the focus ring 24 can be further increased.

The deviation in the critical dimension or the shape of the pattern is calculated by the computer 18 of the spectroscopic ellipsometer 1. Otherwise, the critical dimension or the shape of the pattern may be transmitted from the spectroscopic ellipsometer 1 to the plasma processing apparatus 20, and the deviation in the critical dimension or the shape of the pattern may be calculated by the computer 30 of the plasma processing apparatus 20.

The spectroscopic ellipsometer 1 is controlled by the computer 18, and the plasma processing apparatus 20 is controlled by the computer 30. Alternatively, the spectroscopic ellipsometer 1 and the plasma processing apparatus 20 may be controlled by a single computer. In this case, the single computer includes a storage unit that stores therein the programs 1P and 2P, the library 1L, and the recipe 1R.

The temperature of the focus ring 24 may be controlled through a feedback control based on the measurement values of the critical dimension or the shape instead of the deviation in measurement values of the critical dimension or the shape.

By way of example, when a BCD at the peripheral portion of the wafer W is greater than a critical value as compared with a BCD at the center of the wafer W, the temperature of the focus ring 24 may be controlled through a feedback control. Otherwise, when a SWA at the peripheral portion of the wafer W is greater than a critical value as compared with a SWA at the center of the wafer W, the temperature of the focus ring 24 may be controlled through a feedback control.

In the present illustrative embodiment, the temperature of the focus ring 24 may be controlled through a feedback control based on the deviation in measurement values of the critical dimension or the shape of the pattern. Instead of the focus ring 24, the wafer W may be controlled. By way of example, a multiple number of temperature sensors and heaters may be embedded in an upper portion of the susceptor 22, and a multiple number of outlets of the gas passage 22b through which the temperature control gas is supplied may be formed on the upper surface of the susceptor 22 in contact with the wafer W. Further, a certain area of the electrostatic chuck 25 may be provided with openings corresponding to the outlets of the gas passage 22b. With this configuration, the temperature control gas can be supplied to an interface between the electrostatic chuck 25 and the wafer W. Accordingly, the wafer W is heated by the heaters or cooled by the temperature control gas based on the measured temperature from the temperature sensors under the control of the CPU 31. At this time, the CPU 31 controls a temperature distribution of the wafer W based on the deviation in the measurement values of the critical dimension or the shape of the pattern.

Since an etching rate depends on a temperature of an etching target object, uniformity of the pattern in the surface of the wafer W can be increased by controlling the temperature distribution of the wafer W. Further, both the temperatures of the focus ring 24 and the wafer W may be controlled at the same time.

The program 1P for operating the spectroscopic ellipsometer 1 may be read out from the optical disk 1d and stored in the storage unit 185 by the disk drive 186. Further, the program 1P may be downloaded from an external information processing unit or a recording device (all not illustrated) connected via the communication unit 187. Alternatively, a semiconductor memory 1c such as a flash memory that stores therein the program 1P may be provided in the spectroscopic ellipsometer 1.

The program 2P for operating the plasma processing apparatus 20 may be read out from the optical disk 1d and stored in the storage unit 35 by the disk drive 36. Further, the program 2P may be downloaded from an external information processing unit or a recording device (all not illustrated) connected via the communication unit 37. Alternatively, a semiconductor memory 1c such as a flash memory that stores therein the program 2P may be provided in the plasma processing apparatus 20.

As described above, the second illustrative embodiment has been explained, and since the other details are the same as the first illustrated embodiment, same reference numerals denote same parts, and explanations thereof are omitted.

What is claimed is:

1. A determining method for determining a replacement time of a focus ring that surrounds a substrate to increase uniformity of a pattern in a surface of the substrate when the pattern is formed by etching a film on the substrate, the determining method comprising:
   measuring a shape or a critical dimension of the pattern;
   calculating a deviation in at least one parameter including one or more of TCD (top critical dimension), BCD (bottom critical dimension), Height (a height of a line formed by etching or a depth of a groove of the pattern), MCD (an average of TCD and BCD) and SWA (side wall angle) from data on the measured shape or the measured critical dimension; and
   determining the replacement time of the focus ring based on the calculated deviation in the at least one parameter when the deviation in the at least one parameter is greater than a predetermined critical value.

2. The determining method of claim 1,
   wherein the shape or the critical dimension of the pattern is measured at an area of about 50 mm from a peripheral portion of the substrate toward a center of the substrate.

3. A determining method of claim 2,
   wherein the shape or the critical dimension of the pattern is measured at an area of about 10 mm to about 30 mm from the peripheral portion of the substrate toward the center of the substrate.

4. A determining method of claim 2,
   wherein the at least one parameter includes the SWA, and the deviation in the SWA is greater than about 0.15 degrees.

5. A determining method of claim 2,
   wherein the at least one parameter includes the Height, and the deviation in the Height is greater than about 6 nm.

6. A determining method of claim 2,
   wherein the at least one parameter includes all of the TCD, the BCD, the Height, the MCD and the SWA, and
   the replacement time of the focus ring is determined based on calculated deviations in all of the TCD, the BCD, the Height, the MCD and the SWA.

* * * * *